(12) United States Patent
Nakaie (10) Patent No.: US 10,685,986 B2
(45) Date of Patent: Jun. 16, 2020

(54) DISPLAY DEVICE AND METHOD FOR MANUFACTURING DISPLAY DEVICE

(71) Applicant: Japan Display Inc., Minato-ku (JP)

(72) Inventor: Hiroki Nakaie, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 16/139,677

(22) Filed: Sep. 24, 2018

(65) Prior Publication Data

US 2019/0103416 A1   Apr. 4, 2019

(30) Foreign Application Priority Data

Sep. 29, 2017   (JP) ................. 2017-190353

(51) Int. Cl.
| | | |
|---|---|---|
| H01L 27/12 | (2006.01) | |
| H01L 51/50 | (2006.01) | |
| H01L 51/56 | (2006.01) | |
| H01L 27/32 | (2006.01) | |
| H01L 51/00 | (2006.01) | |

(52) U.S. Cl.
CPC ........ H01L 27/124 (2013.01); H01L 27/3244 (2013.01); H01L 27/3276 (2013.01); H01L 51/0097 (2013.01); H01L 51/5012 (2013.01); H01L 51/56 (2013.01); H01L 27/1218 (2013.01); H01L 2227/326 (2013.01)

(58) Field of Classification Search
CPC ... H01L 51/0097; H01L 51/56; H01L 27/124; H01L 27/3276; G09F 9/00; G09F 9/30; H05B 33/02; H05B 33/06; H05B 33/10
See application file for complete search history.

(56) References Cited

U.S. PATENT DOCUMENTS

| | | | | |
|---|---|---|---|---|
| 9,419,023 | B2 * | 8/2016 | Tsuruoka | ............ H01L 27/124 |
| 10,170,530 | B2 * | 1/2019 | Sano | ................... H01L 27/3276 |
| 2012/0140424 | A1 * | 6/2012 | Sato | ....................... G02F 1/167 |
| | | | | 361/749 |
| 2015/0187807 | A1 * | 7/2015 | Tsuruoka | ............. H01L 27/124 |
| | | | | 257/347 |
| 2016/0079093 | A1 * | 3/2016 | Tosaya | ............... H01L 25/0657 |
| | | | | 257/774 |

FOREIGN PATENT DOCUMENTS

JP   2011-209405   10/2011

* cited by examiner

*Primary Examiner* — Christine A Enad
(74) *Attorney, Agent, or Firm* — Oblon, McClelland, Maier & Neustadt, L.L.P.

(57) ABSTRACT

A display device includes a resin substrate including a through hole in a terminal area around a display area in which an image is displayed, a circuit layer including a thin film transistor and disposed in the display area on the resin substrate, a wire extending from the circuit layer and formed inside of the through hole, and an IC driver disposed on a side of the resin substrate opposite to a side on which the circuit layer is disposed. The IC driver includes a terminal that protrudes into the through hole and is in contact with the wire formed inside of the through hole such that the IC driver and the circuit layer are electrically connected to each other.

7 Claims, 10 Drawing Sheets

DISPLAY DEVICE AND METHOD FOR MANUFACTURING DISPLAY DEVICE

CROSS-REFERENCE TO RELATED APPLICATION

The present application claims priority from Japanese application JP2017-190353 filed on Sep. 29, 2017, the content of which is hereby incorporated by reference into this application.

BACKGROUND OF THE INVENTION

1. Field of the Invention

The present invention relates to a display device and a method for manufacturing the display device.

2. Description of the Related Art

Display devices having a flexible substrate have been known. Such display devices reduce a frame size by bending areas around a display area and disposing a terminal area, on which electronic components are mounted, on the back side of the display area (e.g., JP2011-209405A).

As disclosed in JP2011-209405A, when bending the flexible substrate, wires on the flexible substrate also need to be bent. This may cause damage, such as a crack, on the wires due to bending stress generated at that time.

SUMMARY OF THE INVENTION

An object of the present invention is to reduce a frame size without damaging wiring.

A display device according to an aspect of the present invention includes a resin substrate including a through hole in a terminal area around a display area in which an image is displayed, a circuit layer including a thin film transistor and disposed in the display area on the resin substrate, a wire extending from the circuit layer and formed inside of the through hole, and an electronic component disposed on a side of the resin substrate opposite to a side on which the circuit layer is disposed. The electronic component includes a protruding portion protruding to the through hole, and includes a terminal that is in contact with the wire formed inside of the through hole such that the electronic component and the circuit layer are electrically connected to each other.

A method for manufacturing a display device according to an aspect of the present invention includes preparing a resin substrate, forming a hole in a terminal area of a display area of the resin substrate, an image being displayed in the display area, disposing a circuit layer on the display area of the resin substrate, forming a wire inside of the hole, the wire extending from the circuit layer, and disposing an electronic component on a side of the resin substrate opposite to a side on which the circuit layer is disposed. In the step of disposing the electronic component, a terminal included in the electronic component is stuck in the hole from a side of the resin substrate opposite to a side in which the hole is formed, thereby forming a through hole such that the terminal is in contact with the wire.

A display device according to an aspect of the present invention includes a flexible substrate including a display area in which an image is displayed and a terminal area in which an electronic component is disposed, the electronic component being disposed in a back side of the display area due to bending of the flexible substrate, and a circuit layer including a thin film transistor and disposed on the display area of the resin substrate. The flexible substrate includes a through hole penetrating the flexible substrate in the terminal area from a side on which the circuit layer is disposed to the back side, and the circuit layer and the electronic component are electrically connected to each other by a wire extending from the circuit layer and formed inside of the through hole.

A method for manufacturing a display device according to an aspect of the present invention includes preparing a flexible substrate, forming a first hole and a second hole in a terminal area around a display area of the flexible substrate, an image being displayed in the display area, disposing a circuit layer on the display area of the flexible substrate, the circuit layer including a thin film transistor, forming a first wire inside of the first hole, the first wire extending from the circuit layer, forming a second wire inside of the second hole, disposing an electronic component on the terminal area such that the electronic component is electrically connected to the second wire, forming a first through hole by penetrating the first hole, and forming a second through hole by penetrating the second hole, and bending the flexible substrate such that the electronic component is disposed on a back side of the display area and the first wire exposed from the first through hole is in contact with the second wire exposed from the second through hole.

DETAILED DESCRIPTION OF THE INVENTION

Embodiments of the present invention will be described below in detail with reference to the accompanying drawings. However, the present invention is not to be limited to the embodiments described below, and can be changed as appropriate without departing from the spirit of the invention.

The accompanying drawings schematically illustrate widths, thicknesses, shapes, or other characteristics of each part for clarity of illustration, compared to actual configurations. However, such a schematic illustration is merely an example and not intended to limit the present invention. In the present specification and drawings, some elements identical or similar to those shown previously are denoted by the same reference signs as the previously shown elements, and thus repetitive detailed descriptions of them may be omitted as appropriate.

Further, in the embodiments, when a positional relationship between a component and another component is defined, if not otherwise stated, the words "on" and "below" suggest not only a case where the another component is disposed immediately on or below the component, but also a case where the component is disposed on or below the another component with a third component interposed therebetween.

Figure 1:
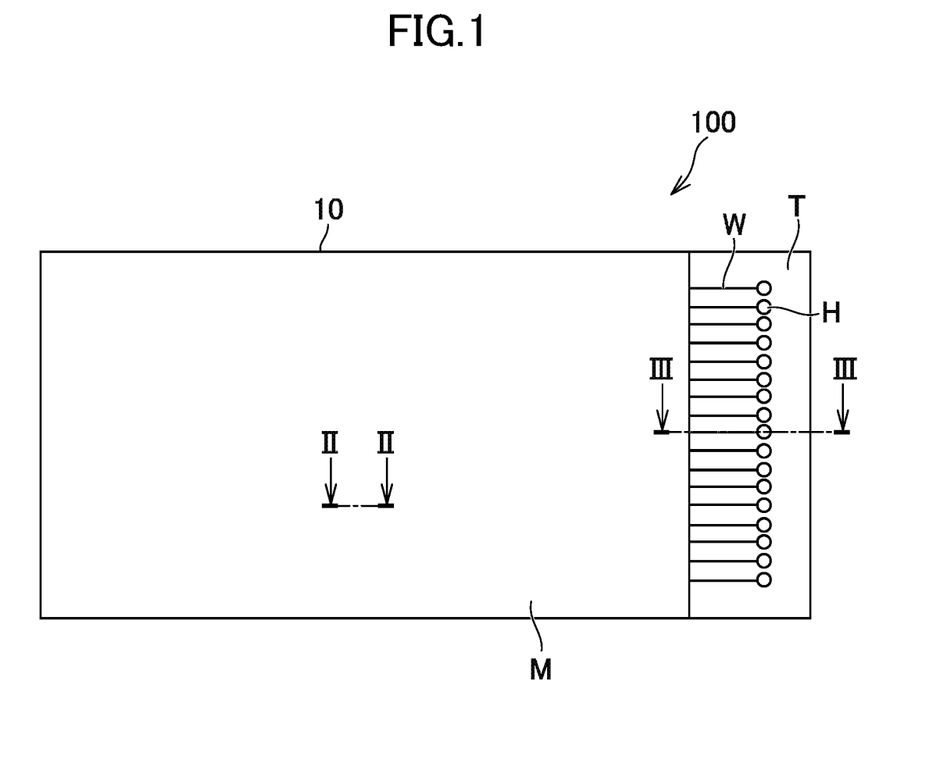
FIG. 1 is a plan view of a display device according to the first embodiment illustrating an overall configuration of the display device.

FIG. 1 is a plan view of a display device according to the first embodiment illustrating an overall configuration of the display device. In the first embodiment, an organic electroluminescent display device is taken as an example of the display device 100. The display device 100 has pixels of a plurality of colors, such as red, green, and blue, and displays full-color images.

The display device 100 includes a resin substrate 10. The resin substrate 10 may be, for example, a rectangular flexible substrate formed of polyimide resin and polyethylene terephthalate. The resin substrate 10 includes a display area M in which a plurality of pixels are disposed in a matrix and images are displayed. The resin substrate 10 includes a terminal area T, which is an area around the display area M and includes electronic components, such as an IC (Integrated Circuit) driver 12 (see FIG. 3) for driving elements for displaying images and a flexible printed circuit substrate 14 (see FIG. 3). Although not shown here, the resin substrate 10 may include a frame area disposed so as to surround the four sides of the display area M.

Figure 2:
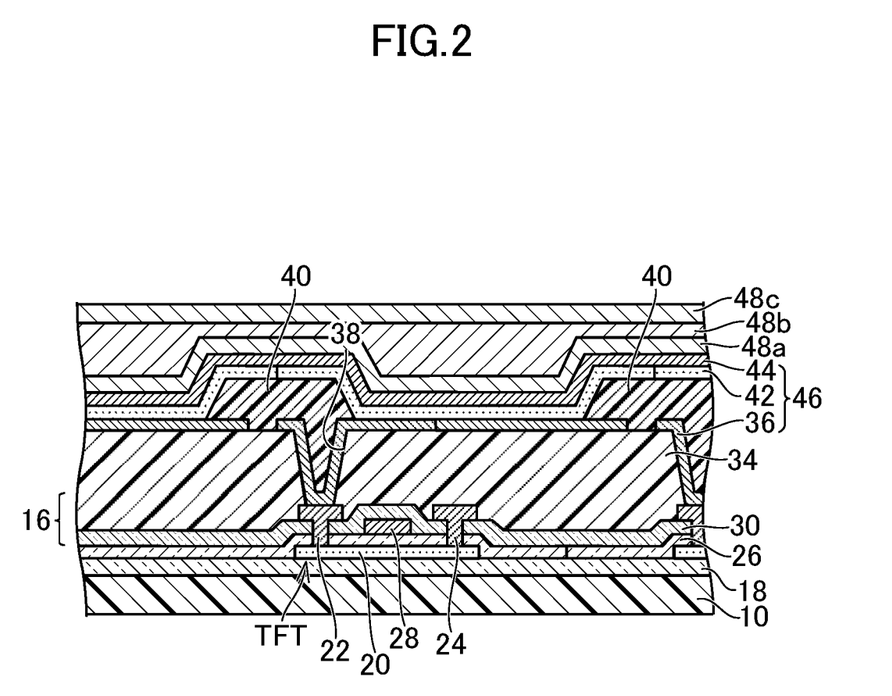
FIG. 2 is a schematic cross sectional view of the display device taken along the line II-II in FIG. 1.

Referring to FIG. 2, details of a laminate structure of the display area M will be described. FIG. 2 is a schematic cross sectional view of the display device taken along the line II-II in FIG. 1, and illustrates the laminate structure of the display area of the display device. An inorganic film 18 is provided on the resin substrate 10 so as to serve as a barrier to impurities included in the resin substrate 10 and to moisture and oxygen in the air. The inorganic film 18 may include inorganic insulating materials, such as silicone oxide and silicon nitride, and may have a laminate structure of films including these materials. A circuit layer 16 including a thin film transistor (TFT) is disposed on the inorganic film 18.

The circuit layer 16 includes a semiconductor layer 20 disposed on the inorganic film 18. A source electrode 22 and a drain electrode 24 are electrically connected to the semiconductor layer 20, and a gate insulating film 26 is formed so as to cover the semiconductor layer 20. The gate insulating film 26 may also include inorganic insulating material. A gate electrode 28 is formed on the gate insulating film 26, and an insulating interlayer 30 is formed so as to cover the gate electrode 28. The insulating interlayer 30 is also made of inorganic material. The source electrode 22 and the drain electrode 24 penetrate the gate insulating film 26 and the insulating interlayer 30. The semiconductor layer 20, the source electrode 22, the drain electrode 24, and the gate electrode 28 form at least a part of the thin film transistor (TFT).

A flattening layer 34 is disposed on the circuit layer 16. On the flattening layer 34, a plurality of pixel electrodes 36 (e.g., anodes) are disposed so as to respectively correspond to the pixels. The flattening layer 34 may be formed of an organic insulator, and is formed so as to be flat at least on a surface on which the pixel electrodes 36 are disposed. The flattening layer 34 may be made of organic material, such as photosensitive acrylic resin. The pixel electrode 36 is electrically connected to one of the source electrode 22 and the drain electrode 24 on the semiconductor layer 20 through a contact hole 38 penetrating the flattening layer 34. An insulating layer (bank) 40 for dividing the pixels are formed on the flattening layer 34 and the pixel electrodes 36. The insulating layer 40 is formed so as to cover the end portions of the pixel electrodes 36.

An organic electroluminescence layer 42 is disposed on the pixel electrodes 36 and the insulating layer 40. Each organic electroluminescence layer 42 is separately provided for a pixel electrode 36, and emits blue, red, or green light corresponding to each pixel. The colors corresponding to the pixels are not limited to those listed above, but may additionally include yellow or white, for example. In a case where a color filter layer is provided, for example, the organic electroluminescence layer 42 may be provided across adjacent pixels.

A common electrode 44 (e.g., cathode) is disposed on the organic electroluminescence layer 42. The common electrode 44 extends over adjacent pixel electrodes 36. The organic electroluminescence layer 42 is disposed between the pixel electrodes 36 and the common electrode 44, controlled in brightness by an electric current that flows therebetween, and emits light. The organic electroluminescence layer 42 includes at least a light-emitting layer, and may include a hole transport layer, a hole injection layer, an electron transport layer, and an electron injection layer, for example. A pixel electrode 36, an organic electroluminescence layer 42, and a common electrode 44 form at least a part of an light-emitting element 46. A sealing film is disposed on the light-emitting element 46 so as to protect the light-emitting element 46 from moisture. The sealing film is formed by laminating an inorganic film 48a made of SiN and SiOx etc., an organic film 48b made of acrylic resin etc. and an inorganic film 48c made of SiN and SiOx, etc. The structure of the sealing film is not limited to this, but may be formed of a single inorganic film, or two or more layers different from the layers indicated in FIG. 2 in the number of layers or the order of layers. Although not shown in FIG. 2, for example, a counter substrate including a color filter, a polarizing substrate, and a touch panel may also be laminated on the sealing film.

Figure 3:
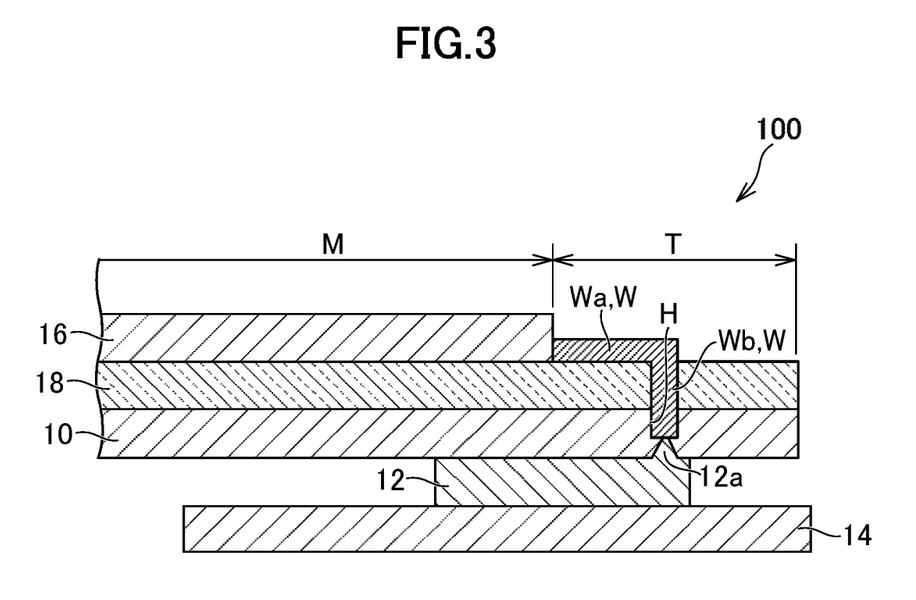
FIG. 3 is a schematic cross sectional view of the display device taken along the line III-III in FIG. 1.

Next, referring to FIGS. 1 to 3, the connection between the circuit layer 16 and electronic components in the first embodiment will be described. FIG. 3 is a cross sectional view of the display device taken along the line III-III in FIG. 1.

As described by reference to FIG. 2, the inorganic film 18 is disposed on the resin substrate 10, and the circuit layer 16 is disposed on the inorganic film 18. In this regard, as described by reference to FIG. 2, the layers such as the organic electroluminescence layer 42 are disposed on the circuit layer 16, although not shown in FIG. 3.

An IC driver 12 is disposed on the side of the resin substrate 10 opposite to the side on which the circuit layer 16 is disposed. The IC driver 12 is an electronic component mounted on the resin substrate 10 as a chip on glass (COG), and sends a driving signal to the display area M through wires W described later. As shown in FIGS. 1 and 3, the wires W are formed on the resin substrate 10 so as to extend from the circuit layer 16 (display area M) to the terminal area T. Further, through holes H are formed in the terminal area T of the resin substrate 10 and the inorganic film 18. As shown in FIG. 1, the through holes H are formed along a direction intersecting the direction in which the wires W extend. As shown in FIG. 3, a wire W is formed inside of a through hole H. In the following, portions of a wire W are described as a wire Wa and a wire Wb. The wire Wa is extended from the circuit layer 16 and formed along the flat surface of the resin substrate 10, and the wire Wb is formed inside the through hole H. The flexible printed circuit substrate 14 is disposed on the side of the IC driver 12 opposite to the side on which the resin substrate 10 is disposed. The flexible printed circuit substrate 14 is an electronic component that supplies power and signals to the display device 100, for example.

While being disposed on the resin substrate 10, the IC driver 12 includes a terminal 12a that projects to the through hole H. A terminal 12a may be provided to each of the wires W. The terminal 12a sticks in the resin substrate 10, and is in contact with the wire Wb at the end. This allows the IC driver 12 and the circuit layer 16 to be electrically connected to each other through the wire W. As shown in FIG. 3, the terminal 12a may be tapered so as to stick in the resin substrate 10.

The display device 100 according to the first embodiment allows the circuit layer 16 to be electrically connected to the electronic components provided outside of the display area M, such as the IC driver 12 and the flexible printed circuit substrate 14, through the wire W without bending the wire W. The inorganic film 18 also needs not to be bent, and thus, for example, a crack due to bending stress is not generated in the inorganic film 18. The electronic components are disposed on the back side of the display area M, which eliminates the need of increasing the size of the area around the display area M. In other words, a frame size can be reduced.

Although one type of wire W is shown in FIGS. 1 and 3, but the wire W is not limited to this. A plurality of types of wires supplying signals etc. may be connected to the electronic components through the through holes H. The IC driver 12 includes a booster circuit, and power and signals may be supplied from the flexible printed circuit substrate 14 to the circuit layer 16 through the IC driver 12.

Figure 4:
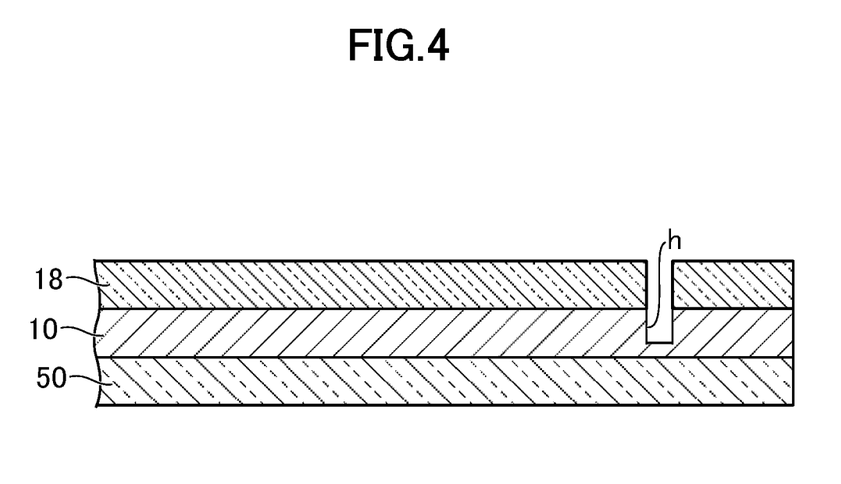
FIG. 4 is a diagram for explaining the manufacturing process of the display device according to the first embodiment.
Figure 5:
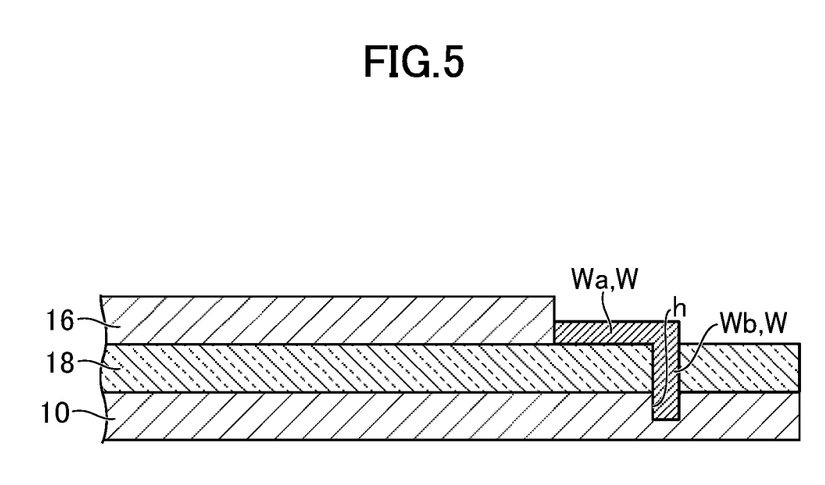
FIG. 5 is a diagram for explaining the manufacturing process of the display device according to the first embodiment.

Next, with reference to FIGS. 3 to 5, a manufacturing process of the display device 100 according to the first embodiment will be described. FIGS. 4 and 5 are diagrams for explaining the manufacturing process of the display device according to the first embodiment.

First, a glass substrate 50 is prepared. The resin substrate 10 is disposed on the glass substrate 50. The resin substrate 10 is thus disposed on the glass substrate 50 having high stiffness, which facilitates the subsequent laminating process. Further, the inorganic film 18 is disposed on the resin substrate 10. Subsequently, etching is performed to form holes h in an area corresponding to the terminal area T in the inorganic film 18 and the resin substrate 10. A plurality of holes h may be formed along a direction intersecting the direction in which the wires W described later extend. At this time, as shown in FIG. 4, the hole h may not penetrate the resin substrate 10, and preferably a part of the resin substrate 10 may remain at the bottom of the hole h. For example, in a case where the thickness of the entire resin substrate 10 is 10 to 20 μm, the resin substrate 10 of about 1 μm thickness may preferably remain at the bottom of the hole h formed by etching.

The circuit layer 16 is disposed on an area that is on the inorganic film 18 and corresponds to the display area M of the display device 100. Details of laminating process of the circuit layer 16 and the organic electroluminescence layer 42 thereon will be omitted here.

In the laminating process of the circuit layer 16, a plurality of wires W are extended from the circuit layer 16 to the terminal area T, and respectively provided in the holes h. Subsequently, for example, a laser beam is irradiated to remove the glass substrate 50 from the resin substrate 10, achieving the state illustrated in FIG. 5. In the process of removing the glass substrate 50, if the holes h penetrate the resin substrate 10 and the wires W are exposed, there is a possibility that the exposed wires W are damaged due to the laser irradiation. However, as described above, since the resin substrate 10 is partially left at the bottom of the holes h, this problem does not arise.

After the glass substrate 50 is removed from the resin substrate 10, the electronic components such as the IC driver 12 and the flexible printed circuit substrate 14 are disposed on the side of the resin substrate 10 opposite to the side on which the circuit layer 16 is disposed. The IC driver 12 may be, for example, pressure-joined with the resin substrate 10 using an anisotropic conductive film (AFC). At this time, the terminal 12a included in the IC driver 12 is stuck into the bottom of the hole h of the resin substrate 10. This allows the terminal 12a to stick and penetrate the part of resin substrate 10, which is left by the etching, so as to form a through hole H. At this time, the terminal 12a is in contact with a wire W2 provided inside the through hole H. This electrically connects the circuit layer 16 to the IC driver 12 through the wire W. The display device 100 shown in FIG. 3 is thus obtained though the above described steps.

Figure 6:
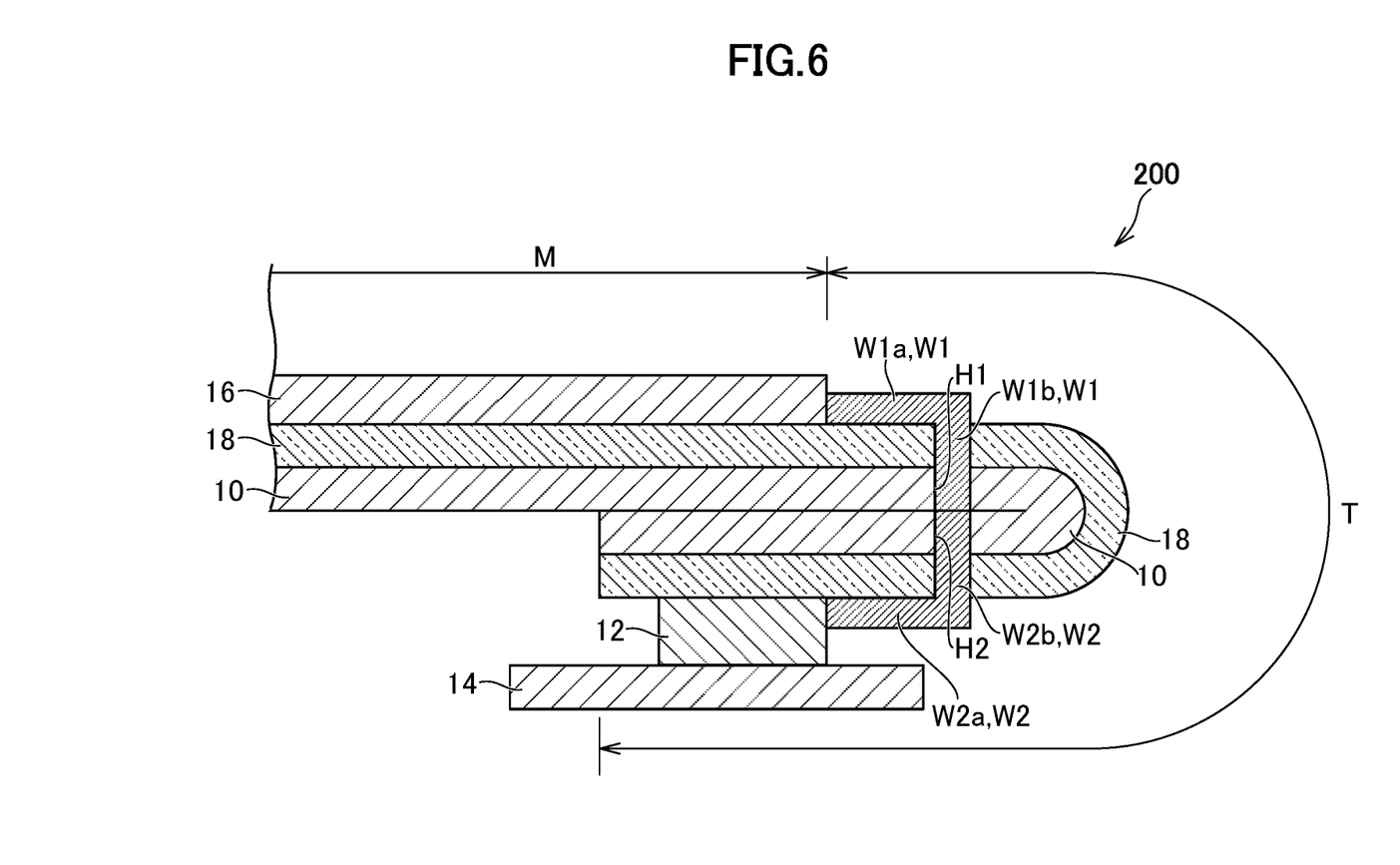
FIG. 6 is a schematic sectional view of the display device according to the second embodiment.

Next, with reference to FIG. 6, a display device 200 according to the second embodiment will be described. FIG. is a schematic sectional view of the display device according to the second embodiment. The configuration described in the first embodiment with reference to FIGS. 1 and 2 is the same as that in the second embodiment, and thus elements that are the same or equivalent are labeled with the same reference numerals and their overlapping explanation will be omitted.

The display device 200 includes a resin substrate (flexible substrate) 10, an inorganic film 18, and a circuit layer 16 laminated in this order. The resin substrate 10 includes a display area M in which images are displayed and a terminal area T in which electronic components, such as an IC driver 12, are mounted. The resin substrate 10 is a flexible substrate, and bent so that the terminal area T is disposed on the back side of the display area M. The inorganic film 18 is also bent so as to be along the resin substrate 10. The resin substrate 10 is bent and bonded together at the inside of the bent portion with an adhesive agent, for example, thereby maintaining the bent state.

A through hole H1 and a through hole H2 are formed on the terminal area T of the resin substrate 10. The through hole H1 is formed on the display surface side of the bent resin substrate 10, and the through hole H2 is formed on the back side of the display surface side of the bent resin substrate 10. The through hole H1 and the through hole H2 are disposed so as to overlap with each other, thereby forming a single through hole.

A wire W1 is extended from the circuit layer 16 and formed inside the through hole H1. The wire W1 includes portions described as a wire W1a and a wire W1b. The wire W1a is extended from the circuit layer 16 and formed along the flat surface of the resin substrate 10, and the wire W1b is formed inside the through hole H1. Further, a wire W2 electrically connected to the IC driver 12 is extended from the IC driver 12 to the through hole H2, and formed inside the through hole H2. The wire W2 includes portions described as a wire W2a and a wire W2b. The wire W2a is extended from the IC driver 12 to the through hole H2 and formed along the flat surface of the resin substrate 10, and the wire W2b is formed inside the through hole H2.

The wire W1b and the wire W2b are bonded to each other at the ends with an adhesive agent, for example, and electrically connected to each other. In other words, the circuit layer 16 and the IC driver 12 are electrically connected to each other through the wire W1 and the wire W2.

In the display device 200 according to the second embodiment, the wire W1 and the wire W2 are not bent along the bending of the resin substrate 10. As such, these wires are not damaged due to bending stress, for example. The bent portion of the inorganic film 18 shown in FIG. 6 may be removed.

Next, with reference to FIGS. 6 to 10, a manufacturing process of the display device according to the second embodiment will be described. FIGS. 7 to 10 are diagrams for explaining the manufacturing process of the display device according to the second embodiment.

Figure 7:
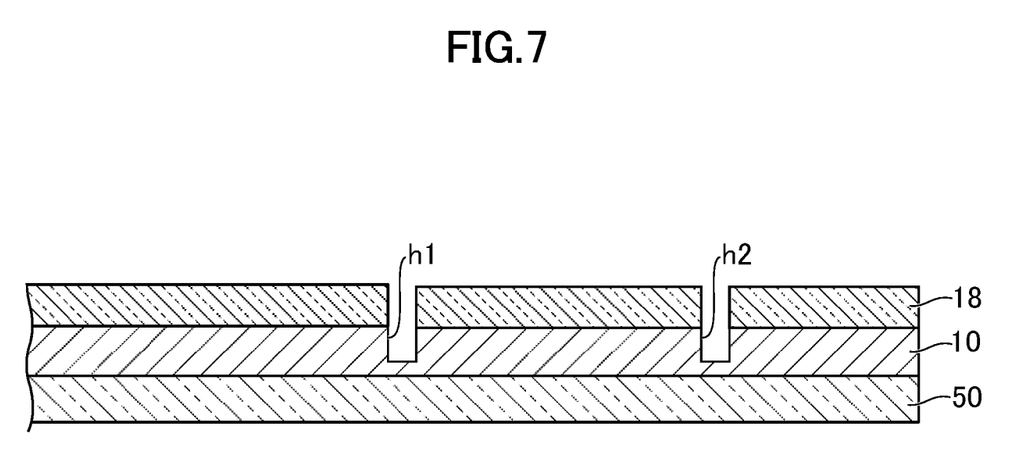
FIG. 7 is a diagram for explaining the manufacturing process of the display device according to the second embodiment.

First, a glass substrate 50 is prepared. Then, a resin substrate 10 having flexibility (flexible substrate) is disposed on the glass substrate 50. The resin substrate 10 is thus disposed on the glass substrate 50 having high stiffness, which facilitates the subsequent laminating process. Further, an inorganic film 18 is disposed on the resin substrate 10. Subsequently, holes h1 and h2 are formed by etching in an area, which corresponds to the terminal area T, in the inorganic film 18 and the resin substrate 10. A plurality of holes h1 may be formed along a direction intersecting the direction in which wires W1 described later extend. A plurality of holes h2 may be formed to be respectively adjacent to the holes h1. As shown in FIG. 7, the hole h1 and the hole h2 do not penetrate the resin substrate 10, and preferably a part of the resin substrate 10 may be left. The hole h1 is formed in the terminal area T of the resin substrate 10 in an area closer to the display area M than the bent area. The hole h2 is formed in the terminal area T of the resin substrate 10 in an area opposite to the display area M across the bent area.

Figure 8:
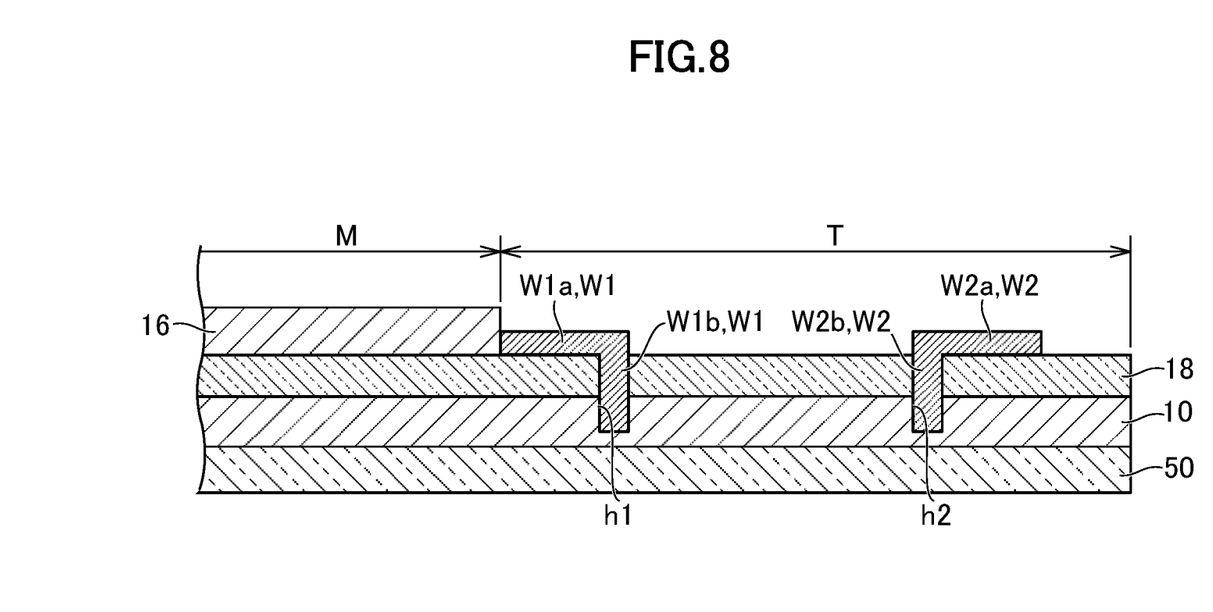
FIG. 8 is a diagram for explaining the manufacturing process of the display device according to the second embodiment.

As shown in FIG. 8, a circuit layer 16 is disposed on an area that is on the inorganic film 18 and corresponds to the display area M of the display device 100. Details of laminating process of the circuit layer 16 and the organic electroluminescence layer 42 thereon will be omitted here.

Figure 9:
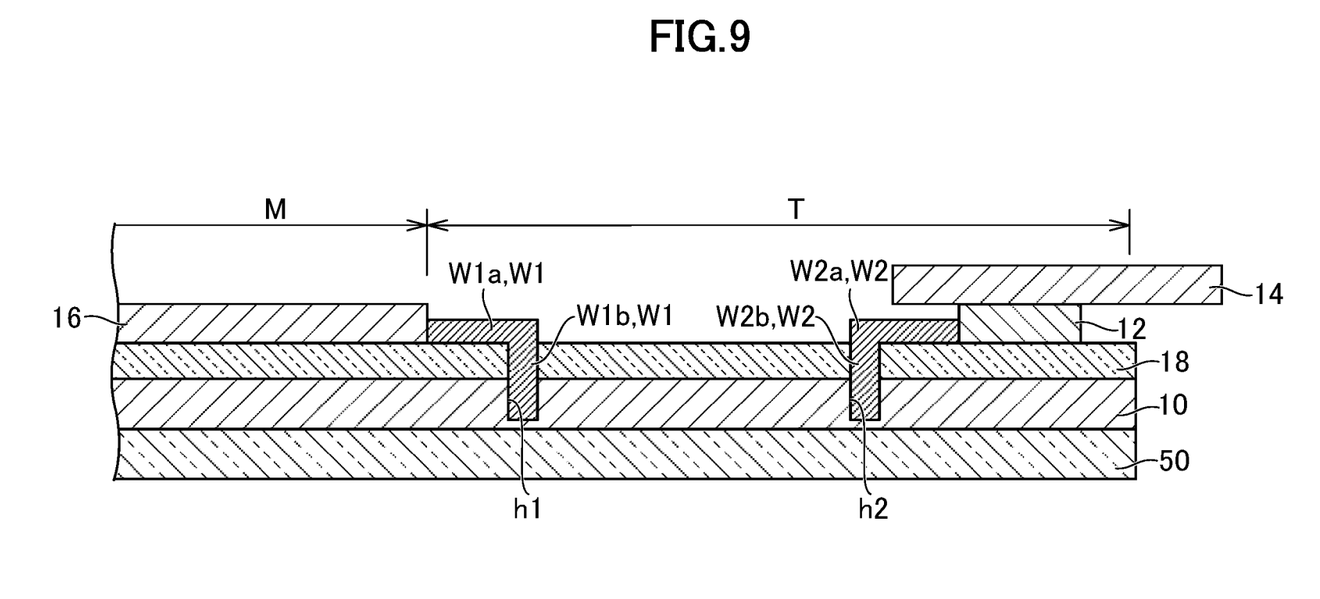
FIG. 9 is a diagram for explaining the manufacturing process of the display device according to the second embodiment.

In the laminating process of the circuit layer 16, a plurality of wires W1 are extended from the circuit layer 16 to the terminal area T, and respectively provided in the holes h1. A plurality of wires W2 are respectively provided inside of the holes h2 and formed so as to extend from the holes h2 to the side opposite to the display area M. As shown in FIG. 9, the electronic components, such as the IC driver 12 and the flexible printed circuit substrate 14, are mounted on the terminal area T so as to be electrically connected to the wires W2. In this regard, sometimes it is difficult to mount these electronic components on the resin substrate 10 that has low stiffness. However, in the second embodiment, the electronic components are mounted while the resin substrate 10 is supported by the glass substrate 50 having high stiffness, which facilitates the mounting process.

Subsequently, for example, a laser beam is irradiated to remove the glass substrate 50 from the resin substrate 10. Further, after the glass substrate 50 is removed, the surface of the resin substrate 10 on the side on which the glass substrate 50 is disposed is ashed to remove a part of the resin substrate 10. This allows the hole h1 and the hole h2 to penetrate so as to form the through hole H1 and the through hole H2. In accordance with the steps described above, the state shown in FIG. 10 is achieved.

Figure 10:
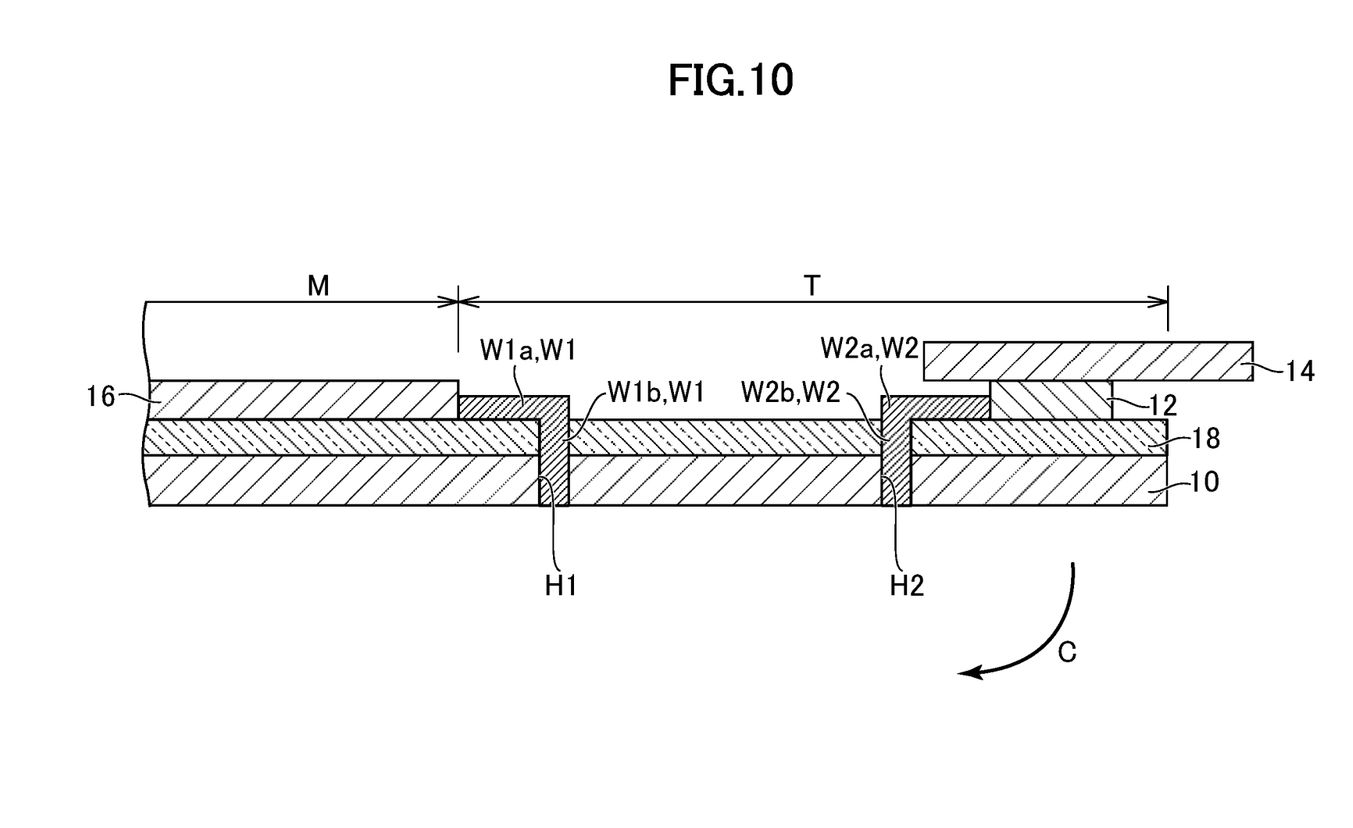
FIG. 10 is a diagram for explaining the manufacturing process of the display device according to the second embodiment.

In the process of removing the glass substrate 50, if the holes h1 and h2 penetrate the resin substrate 10 and the wires W1 and w2 are exposed, there is a possibility that the exposed wires W1 and w2 are damaged due to the laser irradiation. However, as described above, since the resin substrate 10 is partially left at the bottoms of the holes h1 and h2, this problem does not arise.

The resin substrate 10 is bent in the arrow C direction shown in FIG. 10, and thus the electronic components such as the IC driver 12 are disposed on the back side of the display area M. At this time, the resin substrate 10 is bent such that a portion of the wire W1 exposed from the through hole H1 and a portion of the wire W2 exposed from the through hole H2 oppose to each other. At this time, the wire W1 and the wire W2 may be bonded together with a conductive adhesive agent, for example, to be electrically connected to each other. The display device 200 shown in FIG. 6 is thus obtained though the above described steps.

In the above embodiments, the organic electroluminescent display device is used as an example of the display device, although the display device is not limited to this example, but may be a liquid crystal display device, for example.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device comprising:
   a resin substrate including a through hole in a terminal area around a display area in which an image is displayed;
   a circuit layer including a thin film transistor and disposed in the display area on the resin substrate;
   a wire extending from the circuit layer and formed inside of the through hole; and
   an electronic component disposed on a side of the resin substrate opposite to a side on which the circuit layer is disposed, wherein
   the electronic component includes a terminal that protrudes into the through hole and is in direct contact with the wire formed inside of the through hole such that the electronic component and the circuit layer are electrically connected to each other,
   wherein a side surface of the terminal is in contact with the resin substrate.

2. The display device according to claim 1, wherein
   a height of a protruding portion that protrudes into the through hole of the terminal is equal to or less than a thickness of the resin substrate.

3. The display device according to claim 1, wherein
   a top surface width of a protruding portion that protrudes into the through hole of the terminal is smaller than a bottom surface width of the protruding portion.

4. The display device according to claim 1, wherein
   a top surface of a protruding portion that protrudes into the through hole of the terminal is in contact with the wire.

5. The display device according to claim 1,
   the through hole and the terminal are overlapping each other in a plan view.

6. A display device comprising:
- a resin substrate including a through hole in a terminal area around a display area in which an image is displayed;
- a circuit layer including a thin film transistor and disposed in the display area on the resin substrate;
- a wire extending from the circuit layer and formed inside of the through hole; and
- an electronic component disposed on a side of the resin substrate opposite to a side on which the circuit layer is disposed, wherein
- the electronic component includes a terminal that protrudes into the through hole and is in contact with the wire formed inside of the through hole such that the electronic component and the circuit layer are electrically connected to each other, and
- the through hole and the terminal are overlapping each other in a plan view,
- wherein a side surface of the terminal is in contact with the resin substrate.

7. A method for manufacturing a display device comprising:
- preparing a resin substrate;
- forming a hole in a terminal area of a display area of the resin substrate, an image being displayed in the display area,
- disposing a circuit layer on the display area of the resin substrate;
- forming a wire inside of the hole, the wire extending from the circuit layer; and
- disposing an electronic component on a side of the resin substrate opposite to a side on which the circuit layer is disposed, wherein
- in the step of disposing the electronic component, a terminal included in the electronic component is stuck in the hole from a side of the resin substrate opposite to a side in which the hole is formed, thereby forming a through hole such that the terminal is in direct contact with the wire, and
- wherein a side surface of the terminal is in contact with the resin substrate.

\* \* \* \* \*